United States Patent
Lupo

(10) Patent No.: US 12,119,071 B2
(45) Date of Patent: Oct. 15, 2024

(54) ERROR CHECK FUNCTIONALITY VERIFICATION USING KNOWN ERRORS

(71) Applicant: Micron Technology, Inc., Boise, ID (US)

(72) Inventor: Francesco Lupo, Munich (DE)

(73) Assignee: MICRON TECHNOLOGY, INC., Boise, ID (US)

( * ) Notice: Subject to any disclaimer, the term of this patent is extended or adjusted under 35 U.S.C. 154(b) by 197 days.

(21) Appl. No.: 17/738,600

(22) Filed: May 6, 2022

(65) Prior Publication Data

US 2023/0360713 A1 Nov. 9, 2023

(51) Int. Cl.
*G11C 29/10* (2006.01)

(52) U.S. Cl.
CPC .................................. *G11C 29/10* (2013.01)

(58) Field of Classification Search
None
See application file for complete search history.

(56) References Cited

U.S. PATENT DOCUMENTS

| 5,357,521 A | * | 10/1994 | Cheng | G11C 29/10 |
| | | | | 714/720 |
| 2007/0226551 A1 | * | 9/2007 | Janke | G06F 21/79 |
| | | | | 714/E11.04 |
| 2019/0164625 A1 | * | 5/2019 | Park | G11C 29/38 |
| 2020/0117540 A1 | * | 4/2020 | Boehm | G06F 11/1016 |

FOREIGN PATENT DOCUMENTS

DE 102006001873 B4 * 12/2009 ......... G06F 11/1004

* cited by examiner

*Primary Examiner* — April Y Blair
*Assistant Examiner* — Matthew W Wahlin
(74) *Attorney, Agent, or Firm* — NICHOLSON DE VOS WEBSTER & ELLIOTT LLP

(57) ABSTRACT

Methods, systems, and apparatuses include receiving, from a host, an error check functionality request for a memory device that stores encoded data. The encoded data is written to a verification portion of memory with at least one intentional error. A read command of the verification portion is initiated in response to the request. An error check functionality indicator is determined based on a result of the read command and a number of intentional errors in the encoded data. The error check functionality indicator corresponding to the number intentional errors in the encoded data is sent to the host.

20 Claims, 6 Drawing Sheets

ERROR CHECK FUNCTIONALITY VERIFICATION USING KNOWN ERRORS

TECHNICAL FIELD

The present disclosure generally relates to error check functionality, and more specifically, relates to error check functionality verification using known errors.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
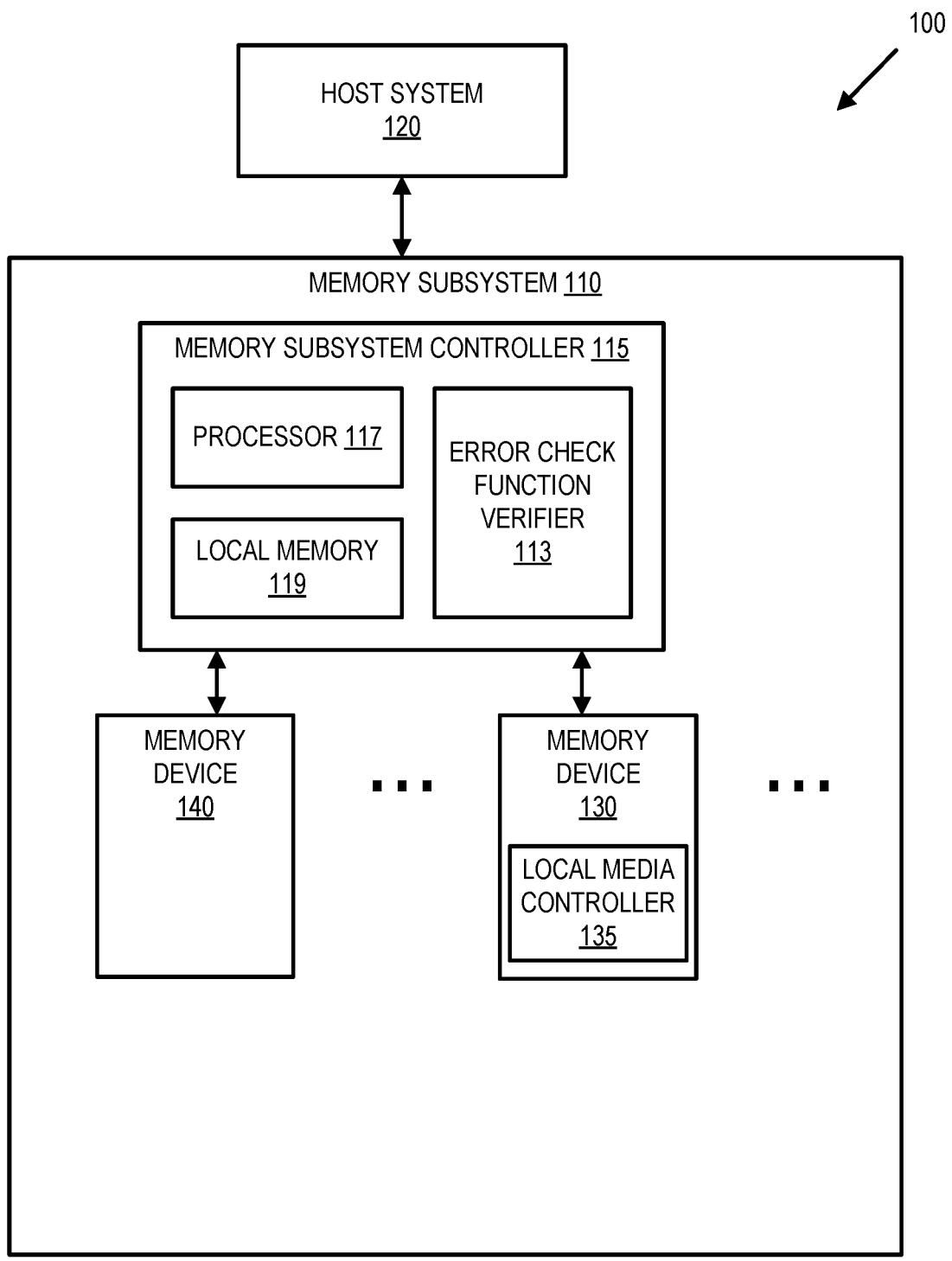
FIG. 1 illustrates an example computing system that includes a memory subsystem in accordance with some embodiments of the present disclosure.

Aspects of the present disclosure are directed to error check functionality verification in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN).

For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

In conventional memory subsystems, error correction codes are written to reserved areas of the memory, not directly accessible to the user but accessible to the error correction decoder to help the processor determine whether data has been damaged. Conventional memory subsystems can detect and correct data reading errors through use of these error correction codes. It is important, especially during verification and debugging, for users to understand how the memory subsystem handles error correction codes but it is very difficult to generate an artificial error correction code event. In conventional systems, users build complicated experiments when creating an artificial error correction code event. These complicated experiments, however, may not work and may cause unexpected and potentially harmful situations to the memory subsystem. This problem is especially prevalent in memory subsystems with intrinsically low bit error rates (BER).

Aspects of the present disclosure address the above and other deficiencies by providing the ability to generate artificial error correction code events that result in a controlled and reproducible environment for verifying the functionality of error correction code event handling in memory subsystems. A user verifying the functionality of the error correction code event handling or debugging the memory subsystem can use the artificial error correction code events to determine whether the memory subsystem is functioning as intended without the need to devise complicated and potentially harmful experiments.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an error check function verifier component 113 that can check the functionality of the error correction code handling. In some embodiments, the controller 115 includes at least a portion of the error check function verifier component 113. For example, the controller 115 can include a processor 117 (processing device) configured to execute instructions stored in local memory 119 for performing the operations described herein. In some embodiments, an error check function verifier component 113 is part of the host system 110, an application, or an operating system.

The error check function verifier component 113 generates calibrated errors and can determine the functionality of the error correction code handling for the memory subsystem. Further details with regards to the operations of the error check function verifier component 113 are described below.

Figure 2:
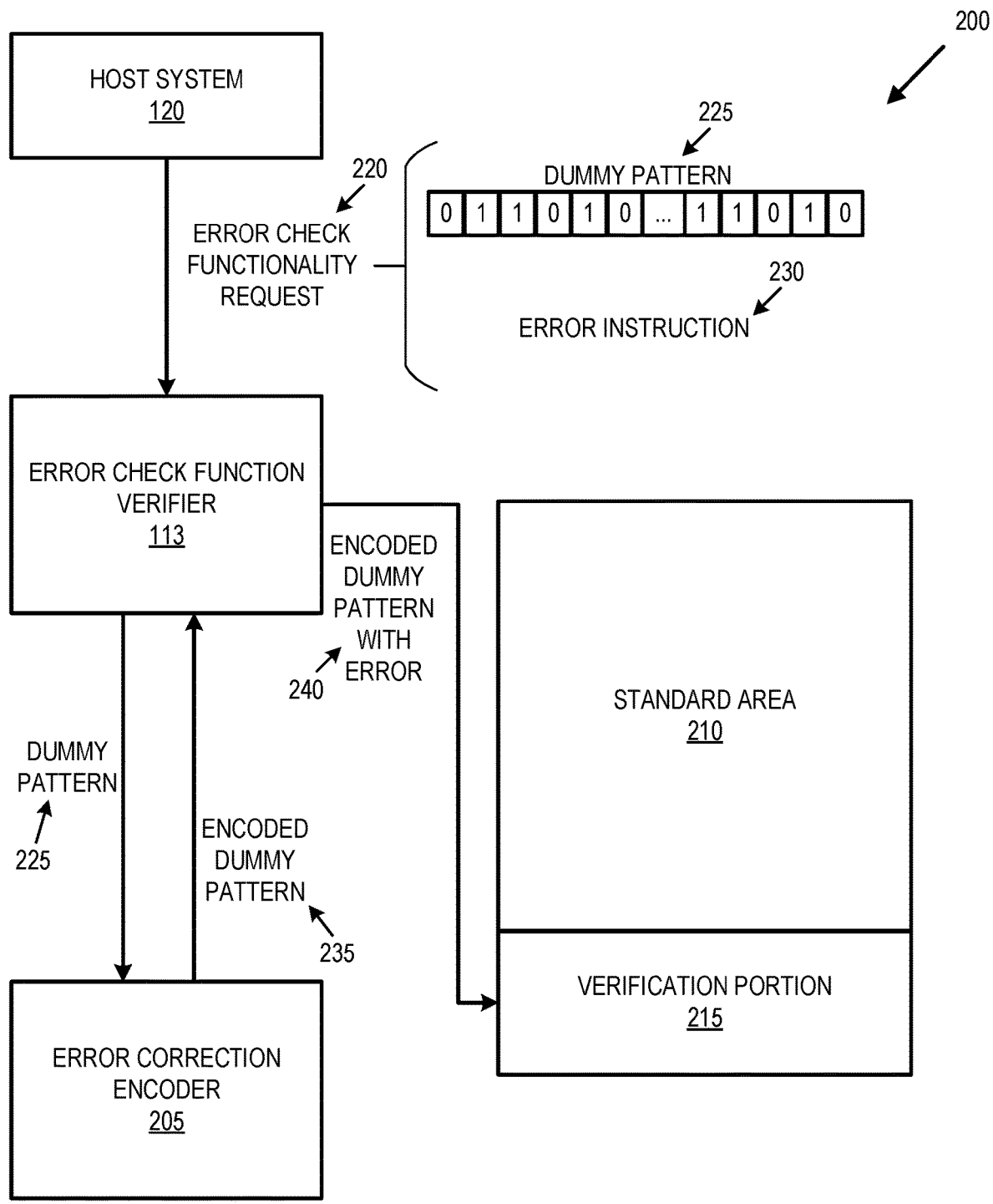
FIG. 2 is a block diagram of an example error check function verification system in accordance with some embodiments of the present disclosure.

FIG. 2 is a block diagram of an example error check function verifier system 200 in accordance with some embodiments of the present disclosure. Host system 120 is coupled to error check function verifier component 113 allowing for bidirectional communication. Error check function verifier component 113 is also coupled to error correction encoder 205 allowing for bidirectional communication. For example, error check function verifier 113 sends data to error correction encoder which encodes the data using an error correcting code and returns the encoded data back to error check function verifier 113. In some embodiments, although illustrated as separate components, error check function verifier 113 and error correction encoder 205 are a single component that can receive error check functionality request 220 and send encoded dummy pattern with error 240.

In some embodiments, as shown in FIG. 2, host system 120 sends error check functionality request 220 to error check function verifier 113. Error check functionality request 220 is a request to determine the functionality of the error correction code handling for a memory subsystem, such as memory subsystem 110 of FIG. 1. For example, error check functionality request 220 can test the error correction code handling for a predetermined number of errors, such as reads that will generate results indicating 0, 1, 2, or more errors. To generate these controlled and reproducible error correction code events, error check functionality request 220 can include dummy pattern 225 and error instruction 230. In some embodiments, host system 120 provides memory subsystem 110 with dummy pattern 225 prior to/separate from error check functionality request 220. In some embodiments, error check function verifier 113 stores dummy pattern 225 to use later as a reference.

In some embodiments, dummy pattern 225 is a structure with an arbitrary predetermined pattern. For example, dummy pattern 225 can store bits of information in an arbitrary pattern. The arbitrary pattern in dummy pattern 225 can but does not need to correlate with any meaningful message or information other than being able to be checked against to determine the functionality of the error correction code handling.

In other embodiments, dummy pattern 225 is a structure with a pattern determined and input by a user of host system 120. For example, the user of host system 120 may be prompted to enter a dummy pattern 225 to be checked via a subsequent read operation to determine the functionality of the error correction code handling. The user of host system 120 may alternatively input dummy pattern 225 without being prompted as part of a command to make host system 120 send error check functionality request 220 including dummy pattern 225.

In some embodiments, error instruction 230 is an instruction to insert a certain number or type of errors into encoded dummy pattern 235. For example, error instruction 230 may be an instruction to insert zero, one, or two errors into encoded dummy pattern 235. Error instruction 230 also indicates whether these errors are flipped bits or more complicated errors involving logical operations on encoded dummy pattern 235. The errors are inserted into encoded dummy pattern 235 rather than dummy pattern 225 because the error correction encoder 205 encodes dummy pattern 225 to verify the accuracy of the data during decoding. Therefore, if the errors were inserted before encoding, the later decoding would indicate that there were no errors and the error correction code handling would not work properly.

In some embodiments, error instruction 230 indicates multiple forms of encoded dummy pattern 235 containing different numbers of errors. For example, error instruction 230 indicates that a version of encoded dummy pattern 235 with no errors, a version of encoded dummy pattern 235 with one error, and a version of encoded dummy pattern 235 with two errors are all written to verification portion 215. By including multiple versions of the same encoded dummy pattern 235 with different numbers of errors, a user of host system 120 can properly verify that the error correction code handling of the memory subsystem, such as memory subsystem 110 of FIG. 1 is working properly by using the encoded dummy pattern 235 with no errors as a reference. In other embodiments, error check function verifier 113 uses different dummy patterns 225 to generate different encoded dummy patterns 235 having different numbers of errors.

As shown in FIG. 2, error check function verifier 113, in response to receiving error check functionality request 220, sends dummy pattern 225 to error correction encoder 205 to be encoded, resulting in encoded dummy pattern 235. Error check function verifier 113 adds a predetermined number of errors to encoded dummy pattern 235 according to error instruction 230. The resulting encoded data with errors is written to verification portion 215 as encoded dummy pattern with error 240. Standard area 210 is an area of memory that is accessible to a user of host system 120 using standard read commands. In contrast, verification portion 215 is an area of memory that is not accessible to a user of host system 120 through standard read commands. For example, error check function verifier 113 accesses verification portion 215 by enabling a special interface and sending a dedicated read command. For example, error check function verifier 113 may use an Extensible Firmware Interface (EFI) command or another command with similar timing as a standard read command that provides restricted access to verification portion 215.

In some embodiments, encoded dummy pattern with error 240 contains three versions of encoded dummy pattern 235 each with a different number of errors. For example, encoded dummy pattern with error 240 contains a copy of each of encoded dummy pattern 235 (with no errors), encoded dummy pattern 235 with one error inserted, and encoded dummy pattern 235 with two errors inserted. Error check function verifier 113 can access each different version of encoded dummy pattern with error 240 separately. In some embodiments, dummy pattern 225 is used as a reference such that a user of host system 120 can determine the functionality of the error correction code handling based on how the memory subsystem, such as memory subsystem 110 handles the different perceived errors.

Error correction encoder 205 encodes dummy pattern 225 sent by error check function verifier 113 based on an error correcting code. For example, error correction encoder 205 can use a Hamming Code to encode dummy pattern 225 with a Hamming distance of three, allowing error check function verifier 113 to correct single bit errors and detect double bit errors. In some embodiments, error correction encoder 205 uses various error correcting codes to encode dummy pattern 225 into encoded dummy pattern 235. The error correcting codes can be based on Hamming Code or Bose-Chaudhuri-Hocquenghem (BCH) Code. Error correction encoder 205 can use various types of error correcting codes that enable detection or correction of errors in the associated data. These error correcting codes may be based on repetition, parity, or a combination of these and other schemes to ensure that the correct data is read from memory.

In some embodiments, error correction encoder 205 is bypassed and error check function verifier 113 inserts the errors according to error instruction 230 directly into dummy pattern 225. For example, instead of a random sequence, dummy pattern 225 may be a sequence that is already encoded with an error correcting code. In such embodiments, error check function verifier 113 bypasses error correction encoder 205 and inserts the errors directly into dummy pattern 225, resulting in encoded dummy pattern with error 240 which is then sent to verification portion 215.

In other embodiments, error correction encoder 205 is bypassed and the errors are already inserted into dummy pattern 225 such that error check function verifier 113 writes dummy pattern 225 directly to verification portion 215. For example, instead of a random sequence, dummy pattern 225 may be a sequence that is already encoded with an error correcting code and has zero, one, or two errors inserted. In such embodiments, error check function verifier 113 bypasses error correction encoder 205 and sends dummy pattern 225 directly to verification portion 215.

Figure 3:
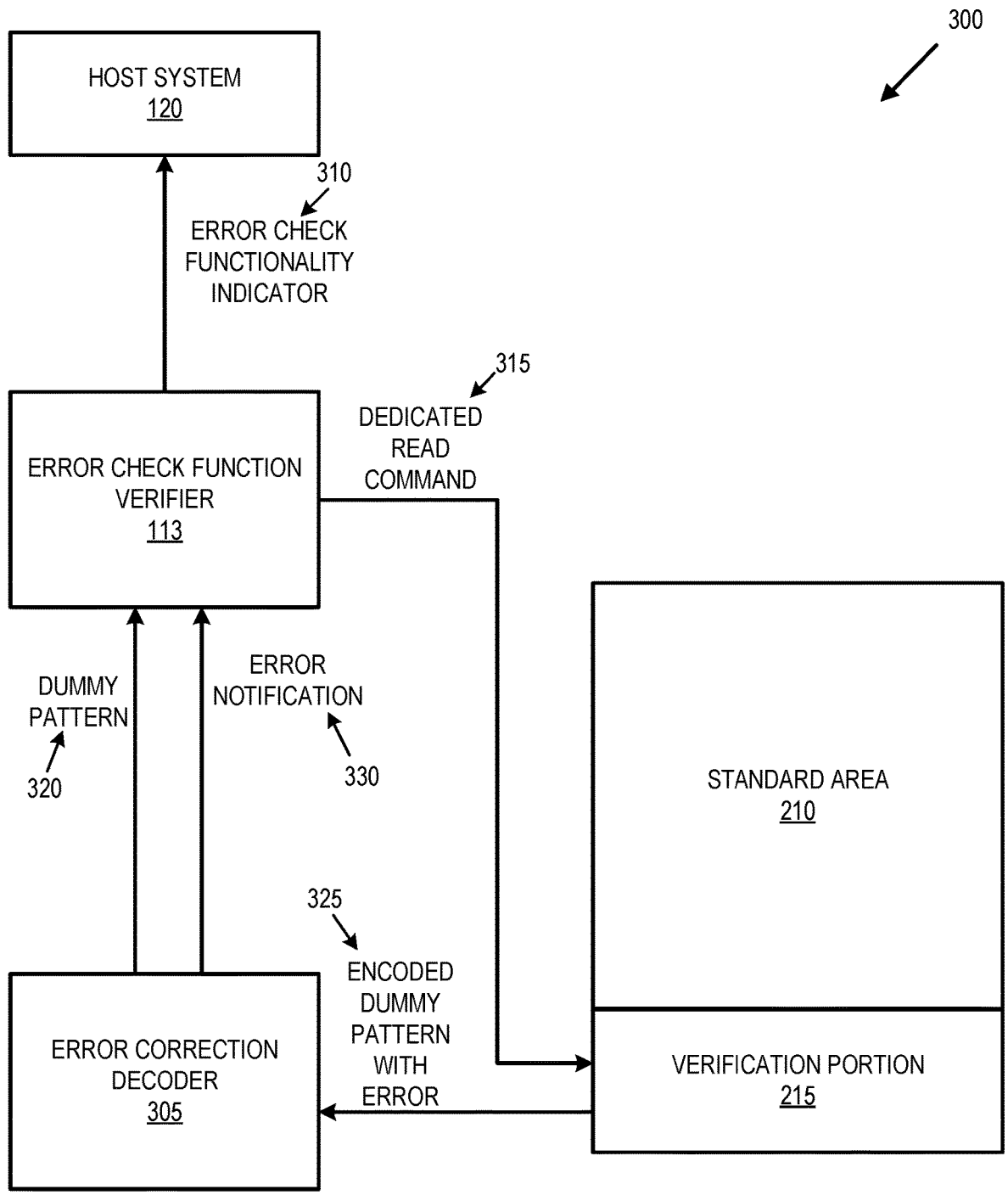
FIG. 3 is a block diagram of an example error check function verification system in accordance with some embodiments of the present disclosure.

FIG. 3 is a block diagram of an example error check function verifier system 300 in accordance with some embodiments of the present disclosure. Host system 120 is coupled to error check function verifier component 113 allowing for bidirectional communication. Error check function verifier 113 also is coupled to error correction code decoder 305 and verification portion 215 of a memory device such as memory device 130 or 140 of FIG. 1. Error check function verifier 113 sends read commands, such as dedicated read command 315, to verification portion 215 and in response verification portion 215 sends encoded dummy pattern with error 325 to error correction decoder 305.

In some embodiments, in response to receiving dedicated read command 315, verification portion 215 sends encoded dummy pattern with error 325 (e.g., the requested version of encoded dummy pattern with error 325 to test the predetermined 0, 1, or 2 errors) to error check function verifier 113. In such embodiments, error check function verifier 113 sends encoded dummy pattern with error 325 to error correction decoder 305. In some embodiments, although illustrated as separate components, error check function verifier 113 and error correction decoder 305 are a single component that can receive encoded dummy pattern with error 325 and send error check functionality indicator 310.

In some embodiments, encoded dummy pattern with error 325 is written to verification portion of memory 215 during initial programming. For example, encoded dummy pattern with error 325 is programmed into verification portion of memory 215 before user operation of memory system 100. In such embodiments, encoded dummy pattern with error 325 is a known pattern written to verification portion 215 before a validation or debugging phase in the operation of the system containing error check function verifier 113.

In some embodiments, encoded dummy pattern with error 325 contains two or three versions of an encoded dummy pattern, such as encoded dummy pattern 235 of FIG. 2, each with a different number of errors. For example, encoded dummy pattern with error 325 contains a copy of encoded dummy pattern (with no errors), a copy of encoded dummy pattern with one error inserted, and a copy of encoded dummy pattern with two errors inserted. In such embodiments, error correction decoder 305 decodes the encoded dummy pattern with no errors and sends the resulting (decoded) dummy pattern 320 to error check function verifier 113 to be used as a reference such that a user of host system 120 can determine the functionality of the error correction code handling based on how the memory subsystem, such as memory subsystem 110 handles the different perceived errors.

In some embodiments, encoded dummy pattern with error 325 is stored in verification portion 215 through a user command such as error check functionality request 220 of FIG. 2. In such embodiments, a user associated with host system 120 sends a dummy pattern and error instruction, such as dummy pattern 225 and error instruction 230 of FIG. B, and, in response, error check function verifier 113 writes encoded dummy pattern with error 325 into verification portion 215.

In some embodiments, verification portion 215 is accessible to a user of host system 120 through dedicated read command 315. Dedicated read command 315 is a command with similar timing as a standard read command. For example, dedicated read command 315 may be an Extensible Firmware Interface (EFI) command or another command with similar timing as a standard read command that provides restricted access to verification portion 215.

In some embodiments, dedicated read command 315 uses the maximum data throughput at which standard area 210 is accessible. The maximum data throughput is the maximum rate at which a memory subsystem controller, such as memory subsystem controller 115 can read or store data in standard area 210.

In some embodiments, when error check function verifier 113 executes dedicated read command 315, error check function verifier 113 subsequently generates signals to provide feedback to host system 120 when the error correction code event occurs, such as error check functionality indicator 310. For example, in response to dedicated read command 315, error correction decoder 305 decodes encoded dummy pattern with error 325 and sends the decoded dummy pattern 320 to error check function verifier 113. However, in the process of decoding, error correction decoder 305 also indicates that there is an error based on a mismatch between the data and parity bits in encoded dummy pattern with error 325 and sends error notification 330 to error check function verifier 113. Error check function verifier 113 then sends error check functionality indicator 310 to host system 120 indicating that there has been an error correction code event.

In some embodiments, error check functionality indicator 310 is an error correction code interrupt signal. The error check functionality indicator 310 therefore mimics the behavior of a memory subsystem, such as memory subsystem 110, when an error correction code event occurs in the standard area 210, causing an error correction code interrupt signal.

In some embodiments, such as when using Hamming Code with Hamming distance of three, error check functionality indicator 310 includes an indication of whether a single bit error has been detected and corrected or whether a double bit error has been detected. For example, error correction decoder 305 decodes encoded dummy patter with error 325 and determines that there was a single bit error. In response to this determination, error correction decoder 305 corrects the single bit error in encoded dummy pattern with error 325 producing dummy pattern 320 and error notification 330. Error correction decoder 305 then sends dummy pattern 320 and error notification 330 to error check function verifier 113.

In some embodiments, error check function verifier 113, in response to receiving dummy pattern 320 and error notification 330 from error correction decoder 305, generates error check functionality indicator 310. For example, error check function verifier 113 checks dummy pattern 320 against a reference pattern, such as dummy pattern 225 of FIG. B. Error check function verifier 113 then determines whether dummy pattern 320 matches the reference dummy pattern. Based on this determination and error notification 330, error check function verifier 113 generates error check functionality indicator 310 which indicates whether the error check handling is working properly.

In some embodiments, error check functionality indicator 310 indicates a number of errors detected as a result of decoding encoded dummy pattern with error 325. For example, error correction decoder 305 decodes encoded dummy pattern with error 325 and determines a number of errors in encoded dummy pattern with error 325. Error correction decoder 305 may determine that there are zero, one, or two errors in encoded dummy pattern with error 325. Error notification 330 therefore indicates the number of errors in encoded dummy pattern with error 325.

Figure 4:
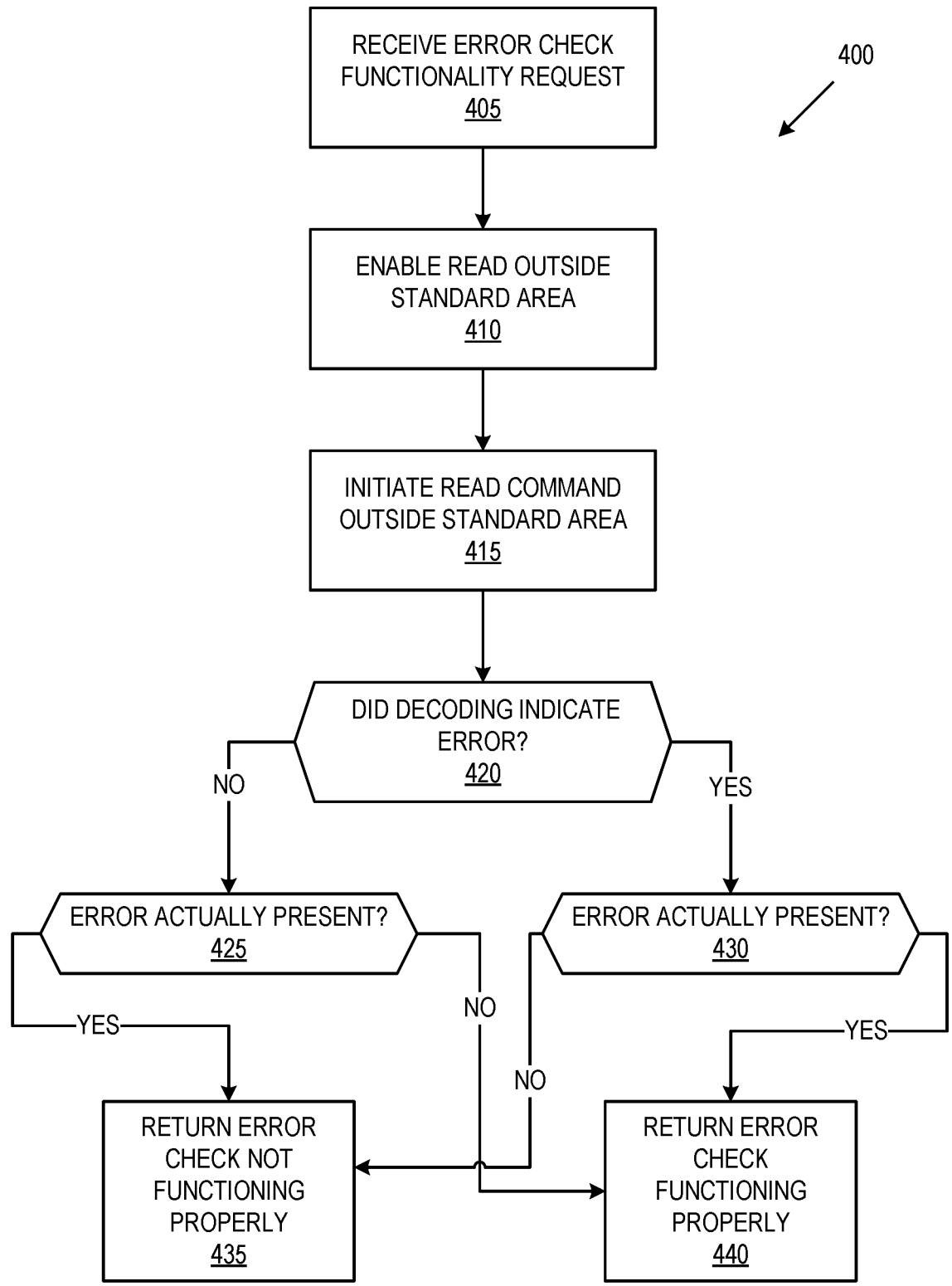
FIG. 4 is a flow diagram of an example method to verify error check functionality in accordance with some embodiments of the present disclosure.

FIG. 4 is a flow diagram of an example method 400 to verify error check functionality, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error check function verifier component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives an error check functionality request. For example, the processing device receives an error check functionality request from a host system, such as host system 120 of FIG. 1 causing the processing device to check the functionality of its error correction code handling. For example, the error check functionality request causes the processing device to read an encoded dummy pattern in a verification portion of memory to detect errors.

In some embodiments, the error check functionality request may include a dummy pattern of data and an error instruction. The processing device may therefore encode the dummy pattern and insert errors according to the error instruction.

At operation 410, the processing device enables read commands outside of the standard area. For example, the processing device enables an interface with a verification portion outside of the standard area such as verification portion 215 of FIGS. 2 and 3. In some embodiments, the processing device enables an EFI interface to send commands to the verification portion outside of the standard area. The processor may enable read commands outside of the standard area through a sub op-code or similar method.

At operation 415, the processing device initiates read command outside of the standard area. For example, the processing device may initiate a command to read a verification portion outside of the standard area such as verification portion 215 of FIGS. 2 and 3. The read command is an individuated command that is specific to the function of determining error check functionality. In some embodiments, the processing device sends an EFI command to read the verification portion outside of the standard area. The processing device may initiate a read of the verification portion with a sub op-code or similar method.

At operation 420, the processing device determines whether the decoding indicated there was an error. For example, the processing device may read an encoded dummy pattern with errors, such as encoded dummy pattern with error 240 or encoded dummy pattern with error 324 of FIGS. 2 and 3 respectively, from memory. The encoded dummy pattern is encoded with an error correcting code and predetermined number of errors. While decoding the encoded dummy pattern with error, processing device will determine whether there are errors in the encoded dummy pattern. For example, the processing device determines that the parity and data bits of the encoded dummy pattern do not match and therefore determines that there was an error.

In other embodiments, the processing device will skip operation 420 (as well as operations 425-440) and, instead, send a signal to a host device indicating a number of errors detected during decoding (e.g., 0, 1, or 2). In such embodiments, the host device, such as host system 120 of FIG. 1, may itself detect whether the number of errors present matches the number of errors injected in the dummy pattern to determine whether the error code correction handling is functioning properly.

At operation 425, in some embodiments, the processing device determines whether an error was actually present. For example, in response to the decoder determining that there were no errors detected in the encoded dummy pattern, the processing device compares a reference dummy pattern against the decoded dummy pattern and determines whether they are the same. If the decoded dummy pattern matches the reference dummy pattern, then the processing device determines there were no errors present and proceeds to operation 440. If instead the decoded dummy pattern does not match the reference dummy pattern, the processing device determines that there were one or more errors present and proceeds to operation 435.

In some embodiments, the processing device will instead check an error instruction indicating whether there were errors in the encoded dummy pattern. If the error instruction indicates there were no errors, the processing device proceeds to operation 440. If, however, the error instruction indicates there are one or more errors, the processing device proceeds to operation 435.

At operation 430, the processing device determines whether an error was actually present. For example, in response to determining that there were errors detected in the encoded dummy pattern, the processing device checks an error instruction indicating whether there were one or more errors in the encoded dummy pattern. If the error instruction indicates there were one or more errors (e.g., the correct number of errors), the processing device proceeds to operation 440. If, however, the error instruction indicates there were no errors, the processing device proceeds to operation 435.

At operation 435, the processing device returns that the error check is not functioning properly. For example, in response to determining that an error was detected where there was no error injected into the encoded dummy pattern, a different number of errors was detected than then number of errors injected into the encoded dummy pattern, or in response to determining that no error was detected where there was an error injected into the encoded dummy pattern, the processing device may send a signal to a host device, such as host system 120 indicating that error check is not functioning properly.

At operation 440, the processing device returns that the error check is functioning properly. For example, in response to determining that a number of errors detected match the number of errors injected into the encoded dummy pattern or in response to determining that no error was detected where there was no error injected into the encoded dummy pattern, the processing device may send a signal to a host device, such as host system 120 indicating that error check is functioning properly.

Figure 5:
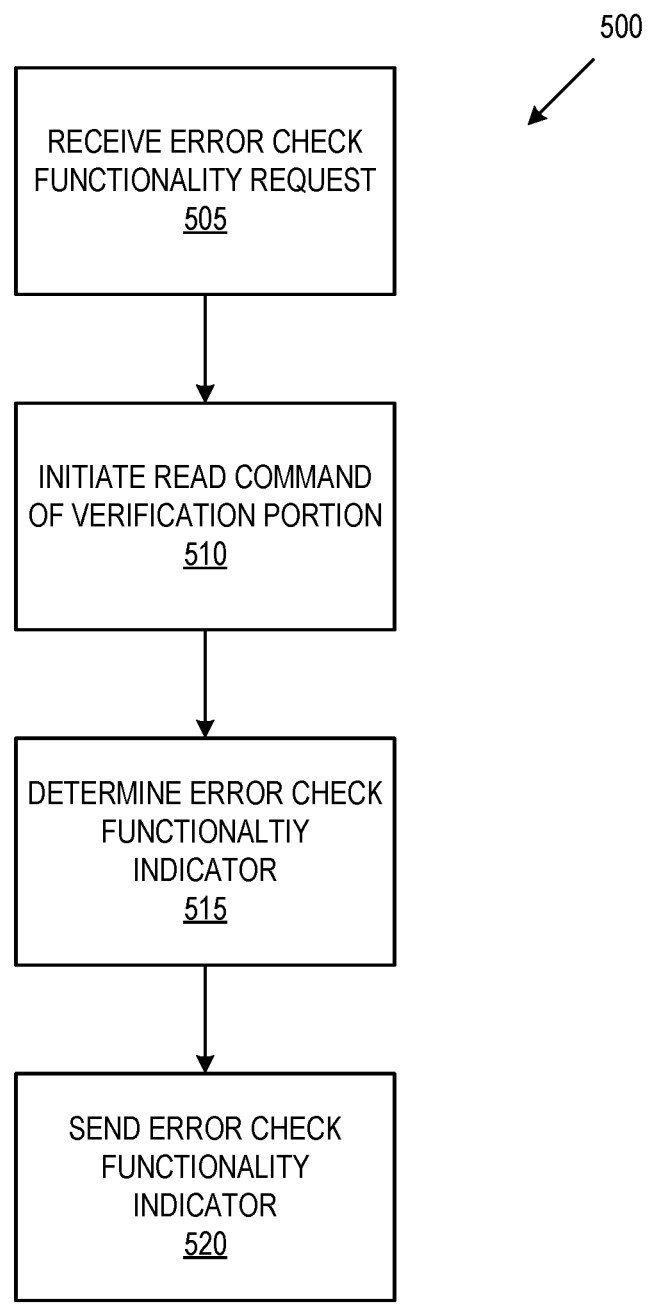
FIG. 5 is another flow diagram of an example method to verify error check functionality in accordance with some embodiments of the present disclosure.

FIG. 5 is another flow diagram of an example method 500 to verify error check functionality, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error check function verifier component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives the error check functionality request. For example, the processing device receives an error check functionality request from a host system, such as host system 120 of FIG. 1 causing the processing device to check the functionality of its error correction code handling. For example, the error check functionality request causes the processing device to read an encoded dummy pattern in a verification portion of memory to detect errors.

In some embodiments, the error check functionality request may include a dummy pattern of data and an error instruction. The processing device may therefore encode the dummy pattern and insert errors according to the error instruction.

At operation 510, the processing device initiates a read command of the verification portion. For example, the processing device enables an interface with a verification portion outside of the standard area such as verification portion 215 of FIGS. 2 and 3. In some embodiments, the processing device enables an EFI interface to send commands to the verification portion outside of the standard area. The processor may enable read commands outside of the standard area through a sub op-code or similar method. The processing device then initiates a command to read a verification portion outside of the standard area such as verification portion 215 of FIGS. 2 and 3. The read command is an individuated command that is specific to the function of determining error check functionality. In some embodiments, the processing device sends an EFI command to read the verification portion outside of the standard area. The processing device may initiate a read of the verification portion with a sub op-code or similar method.

At operation 515, the processing device determines the error check functionality indicator. For example, while executing the read command of the verification portion, the processing device may detect an error during decoding. The processor then sends an error check functionality indicator based on whether an error was detected during decoding. In some embodiments, the error check functionality indicator is an error correction code interrupt signal generated as a result of decoding encoded data with errors. The error check functionality indicator may indicate how many errors were detected and whether the error was fixed.

At operation 520, the processing device sends the error check functionality indicator. For example, the processing device may send the error check functionality indicator from operation 515 to a host device, such as host system 120 of FIG. 1.

Figure 6:
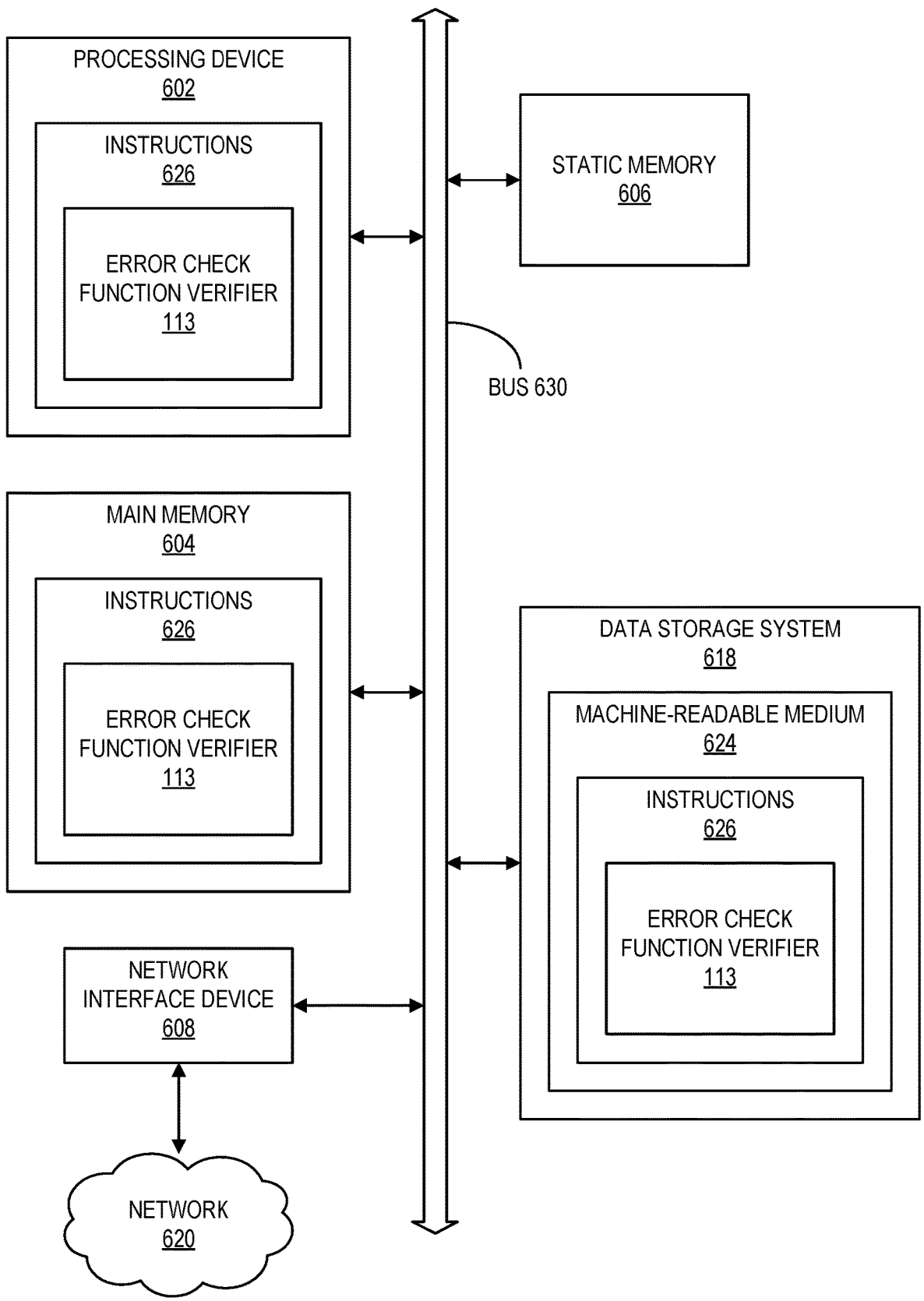
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error check function verifier component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a error check function verifier component (e.g., the error check function verifier component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 400 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, from a host, an error check functionality request for a memory device, wherein the error check functionality request includes an error instruction indicating a number of intentional errors;
writing, to a verification portion of the memory device, encoded data with the number of intentional errors indicated by the error instruction;
initiating a read command of the verification portion, wherein the verification portion of the memory device is readable in response to the error check functionality request;
determining, a number of detected errors using a result of the read command;
generating an error check functionality indicator using the number of detected errors; and
sending, to the host, the error check functionality indicator.

2. The method of claim 1, wherein the verification portion of memory comprises a portion of memory not accessible using standard read commands.

3. The method of claim 1, further comprising:
generating the encoded data by encoding a dummy pattern using an error correcting code.

4. The method of claim 3, wherein the error check functionality request further includes the dummy pattern and wherein receiving the error check functionality request including the dummy pattern causes the writing, to the verification portion, the encoded data.

5. The method of claim 1, wherein the error check functionality indicator comprises an error correction interrupt signal.

6. The method of claim 1, wherein the number of intentional errors comprises one or two errors.

7. The method of claim 1, wherein the error check functionality request comprises an extensible firmware interface command.

8. A non-transitory computer-readable storage medium comprising instructions that, when executed by a processing device, cause the processing device to:
receive, from a host, an error check functionality request for a memory device, wherein the error check functionality request includes an error instruction indicating a number of intentional errors;
write, to a verification portion of the memory device, encoded data with the number of intentional errors indicated by the error instruction;
initiate a read command of the verification portion, wherein the verification portion of the memory device is readable in response to the error check functionality request;
determine, a number of detected errors using a result of the read command;
generate an error check functionality indicator using the number of detected errors; and
send, to the host, the error check functionality indicator.

9. The non-transitory computer-readable storage medium of claim 8, wherein the verification portion of memory comprises a portion of memory not accessible using standard read commands.

10. The non-transitory computer-readable storage medium of claim 8, wherein the processing device is further to:
generate the encoded data by encoding a dummy pattern using an error correcting code.

11. The non-transitory computer-readable storage medium of claim 10, wherein the error check functionality request further includes the dummy pattern and wherein receiving the error check functionality request including the dummy pattern causes the writing, to the verification portion, the encoded data.

12. The non-transitory computer-readable storage medium of claim 8, wherein the error check functionality indicator comprises an error correction interrupt signal.

13. The non-transitory computer-readable storage medium of claim 8, wherein the number of intentional errors comprises one or two errors.

14. The non-transitory computer-readable storage medium of claim 8, wherein the error check functionality request comprises an extensible firmware interface command.

15. A system comprising:
a plurality of memory devices; and
a processing device, operatively coupled with the plurality of memory devices, to:
receive, from a host, an error check functionality request for a memory device, wherein the error check functionality request includes an error instruction indicating a number of intentional errors;
write, to a verification portion of the memory device, encoded data with the number of intentional errors indicated by the error instruction;
initiate a read command of the verification portion, wherein the verification portion of the memory device is readable in response to the error check functionality request and wherein the verification portion comprises a portion of memory not accessible using standard read commands;
determine, a number of detected errors using based on a result of the read command and a number of intentional errors in the encoded data, an error check functionality indicator;
generate an error check functionality indicator using the number of detected errors; and
send, to the host, the error check functionality indicator corresponding to the number intentional errors in the encoded data.

16. The system of claim 15, wherein the processing device is further to:
generate the encoded data by encoding a dummy pattern using an error correcting code.

17. The system of claim 16, wherein the error check functionality request further includes the dummy pattern and wherein receiving the error check functionality request including the dummy pattern causes the writing, to the verification portion, the encoded data.

18. The system of claim 15, wherein the error check functionality indicator comprises an error correction interrupt signal.

19. The system of claim 15, wherein the number of intentional errors comprises one or two errors.

20. The system of claim 15, wherein the error check functionality request comprises an extensible firmware interface command.

* * * * *